United States Patent
Jain et al.

(10) Patent No.: US 8,487,386 B2
(45) Date of Patent: Jul. 16, 2013

(54) METHOD FOR FORMING MEMS DEVICES HAVING LOW CONTACT RESISTANCE AND DEVICES OBTAINED THEREOF

(75) Inventors: Ajay Jain, Albuquerque, NE (US); Simone Severi, Leuven (BE); Gert Claes, Kessel-Lo (BE); John Heck, Berkeley, CA (US)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 265 days.

(21) Appl. No.: 12/817,631

(22) Filed: Jun. 17, 2010

(65) Prior Publication Data

US 2010/0320606 A1    Dec. 23, 2010

Related U.S. Application Data

(60) Provisional application No. 61/218,258, filed on Jun. 18, 2009.

(51) Int. Cl.
*H01L 27/14*    (2006.01)

(52) U.S. Cl.
USPC    257/414; 438/49; 257/E29.324; 257/E21.584

(58) Field of Classification Search
USPC ........... 257/751, E29.324, E21.584, E23.155; 438/7–9, 48–55, 696–700, 706, 627, 785
See application file for complete search history.

(56) References Cited

U.S. PATENT DOCUMENTS

| | | | |
|---|---|---|---|
| 5,317,187 A | 5/1994 | Hindman et al. | |
| 5,985,751 A * | 11/1999 | Koyama | 438/637 |
| 6,498,094 B2 * | 12/2002 | Nakao et al. | 438/650 |
| 6,689,683 B2 * | 2/2004 | Yamamoto | 438/637 |
| 6,787,831 B2 * | 9/2004 | Moon et al. | 257/295 |
| 6,949,461 B2 | 9/2005 | Malhotra et al. | |
| 2008/0211100 A1 | 9/2008 | Lavoie et al. | |

OTHER PUBLICATIONS

Eyoum, Marie-Ange et al., "Low Resistance Silicon-Germanium Contact Technology for Modular Integration of MEMS with Electronics", Journal of Electrochemical Society, vol. 151, No. 7, 2004, p. L5.
Howe, Roger T. et al., "Low-Temperature LPCVD MEMS Technologies", Mat. Res. Soc. Symp. Proc., vol. 729, 2002, pp. U5.1.1-U5.1.9.

* cited by examiner

*Primary Examiner* — Julio J Maldonado
*Assistant Examiner* — Sonya D McCall Shepard
(74) *Attorney, Agent, or Firm* — McDonnell Boehnen Hulbert & Berghoff LLP

(57) ABSTRACT

The present disclosure proposes a method for manufacturing in a MEMS device a low-resistance contact between a silicon-germanium layer and a layer contacted by this silicon-germanium layer, such as a CMOS metal layer or another silicon-germanium layer, through an opening in a dielectric layer stack separating both layers. An interlayer is formed in this opening, thereby covering at least the sidewalls of the opening on the exposed surface of the another layer at the bottom of this opening. This interlayer may comprise a TiN layer in contact with the silicon-germanium layer. This interlayer can further comprise a Ti layer in between the TiN layer and the layer to be contacted. In another embodiment this interlayer comprises a TaN layer in contact with the silicon-germanium layer. This interlayer can then further comprise a Ta layer in between the TaN layer and the layer to be contacted.

19 Claims, 18 Drawing Sheets

METHOD FOR FORMING MEMS DEVICES HAVING LOW CONTACT RESISTANCE AND DEVICES OBTAINED THEREOF

CROSS-REFERENCE TO RELATED APPLICATIONS

The present application claims priority to U.S. Provisional Application No. 61/218,258 filed in the United States Patent and Trademark Office on Jun. 18, 2009, the entire contents of which is incorporated herein by reference.

FIELD

The present disclosure is related to Micro-Electro-Mechanical Systems (MEMS) devices, in particular to MEMS devices comprising silicon germanium layers.

BACKGROUND

Micro-Electro-Mechanical Systems (MEMS) is the integration of mechanical elements, sensors, actuators, and electronics on a common silicon substrate through micro fabrication technology. While the electronics are fabricated using integrated circuit (IC) process sequences (e.g., CMOS, Bipolar, or BICMOS processes), the micromechanical components are fabricated using compatible "micromachining" processes that selectively etch away parts of the silicon wafer or add new structural layers to form the mechanical and electro-mechanical devices.

Poly-crystalline silicon-germanium (poly-SiGe) enables a monolithic CMOS-MEMS integration thanks to the low CMOS-compatible SiGe deposition temperatures, which are typically less than 450° C. FIG. 1 shows an example of such a MEMS-CMOS monolithic integration. Via an interconnect structure the MEMS device is electrically connected to the active devices of the CMOS substrate.

While the mechanical and electrical properties of the SiGe layer itself have been intensively studied, the electrical contact between the MEMS device and the CMOS substrate is of uttermost importance. A low resistive contact between the poly-SiGe layer and the CMOS top metal layer, typically consisting of a TiN/Al layer stack, is needed for a successful monolithic integration with low interconnect parasitic resistance.

Eyoum et al. discloses in "Low-Resistance Silicon-Germanium Contact Technology for Modular Integration of MEMS with Electronics", Journal of Electrochemical Society, 151 (3) J21-J25 (2004), a Ni-silicide process to achieve a low contact resistance between the CMOS top metal layer and the SiGe layer. The CMOS top metal layer was modified to have a thin nickel layer on top of the TiN capping layer. During the deposition of the SiGe layer on this nickel layer the substrate is heated thereby forming a nickel germanosilicide.

The formation of a nickel germanosilicide however does require a complex and costly silicide processing. It is also a non-standard process in the CMOS backend process flow. Moreover the temperature budget of the SiGe formation must now be sufficiently high to allow forming the nickel germanosilicide, hence imposing a lower limit to the SiGe deposition temperature. In this approach the formation of the nickel germanosilicide is linked to the exact composition of the SiGe layer and the SiGe deposition conditions. From FIG. 8 of Eyoum it is clear that even for large contacts at SiGe higher deposition temperature, the contact resistance can still be above 10Ω.

The present disclosure discloses a low contact resistance between a SiGe layer and another layer such as a CMOS top metal layer or a SiGe layer.

The present disclosure discloses a low contact resistance between a SiGe layer and another layer such as a CMOS top metal layer or a SiGe layer whereby this contact resistance shows a small standard deviation.

The present disclosure discloses a low contact resistance between a SiGe layer and another layer such as a CMOS top metal layer or a SiGe layer whereby this contact resistance shows a small standard deviation and whereby the mechanical integrity of this contact is improved.

The present disclosure discloses a cost-efficient method for forming a low resistance contact between a SiGe layer and another layer such as a CMOS top metal layer or a SiGe layer.

The present disclosure discloses a cost-efficient method for forming a low resistance contact between a SiGe layer and another layer such as a CMOS top metal layer or a SiGe layer, independent of the deposition temperature of the SiGe layer(s).

SUMMARY

In a first aspect a MEMS device is disclosed comprising at least one silicon-germanium layer electrically connected through an opening in a dielectric layer stack to another layer, whereby an interface layer separates the at least one silicon-germanium layer from the dielectric layer stack at least in the opening and from the another layer.

This another layer can be a conductive layer such as silicon-germanium layer. This another layer can be a conductive layer such as a metal layer. This metal layer can then be the top metal layer of an interconnect pattern of a CMOS substrate on which the MEMS device is placed.

In one embodiment the interface layer comprises a layer of TiN in contact with the at least one silicon-germanium layer. The interface layer can then further comprise a layer of Ti in contact with the TiN layer and the another layer.

In another embodiment the interface layer comprises a layer of TaN in contact with the at least one silicon-germanium layer. The interface layer can then further comprise a layer of Ta in contact with the TaN layer and the another layer.

The silicon-germanium layer can partially fill, completely fill or even overlap the opening formed in the dielectric layer stack separating both layers: the silicon-germanium layer and the another layer.

In another aspect a method for manufacturing a MEMS device comprising at least one silicon-germanium layer electrically connected through an opening in a dielectric layer stack to another layer, whereby an interface layer separates the at least one silicon-germanium layer from the dielectric layer stack at least in the opening and from the another layer, is disclosed the method comprising providing the another layer, providing the dielectric stack on the another layer, forming the opening in the dielectric stack thereby exposing part of the another layer, forming the interface layer at least on the sidewalls of the opening and on the exposed surface of the another layer, and forming the silicon-germanium layer at least in the opening.

This another layer can be a silicon-germanium layer. This another layer can be a metal layer. This metal layer can then be the top metal layer of an interconnect pattern of a CMOS substrate on which the MEMS device is placed.

In one embodiment the interface layer comprises a layer of TiN in contact with the at least one silicon-germanium layer. The interface layer can then further comprise a layer of Ti in contact with the TiN layer and the another layer. After the formation of the opening and before the interface layer is formed, cleaning steps can be performed. These cleaning steps can be a HF-dip, a H2-plasma, a soft sputter etch by using an Ar-plasma or any combination thereof.

In another embodiment the interface layer comprises a layer of TaN in contact with the at least one silicon-germanium layer. The interface layer can then further comprise a layer of Ta in contact with the TaN layer and the another layer. After the formation of the opening and before the interface layer is formed, cleaning steps can be performed. These cleaning steps can be a HF-dip, a H2-plasma, a soft sputter etch by using an Ar-plasma or any combination thereof.

The silicon-germanium layer can partially fill, completely fill or even overlap the opening formed in the dielectric layer stack separating both layers: the silicon-germanium layer and the another layer.

The silicon-germanium layer can be deposited on the interface layer without having the interface layer exposed to an oxidizing ambient, e.g. by transporting the substrate with the interface layer to the silicon-germanium deposition tool under vacuum conditions.

The $B_2H_6$ flow used when forming the silicon-germanium layer in the opening can be tuned to further reduce the contact resistance.

DETAILED DESCRIPTION

Figure 1:
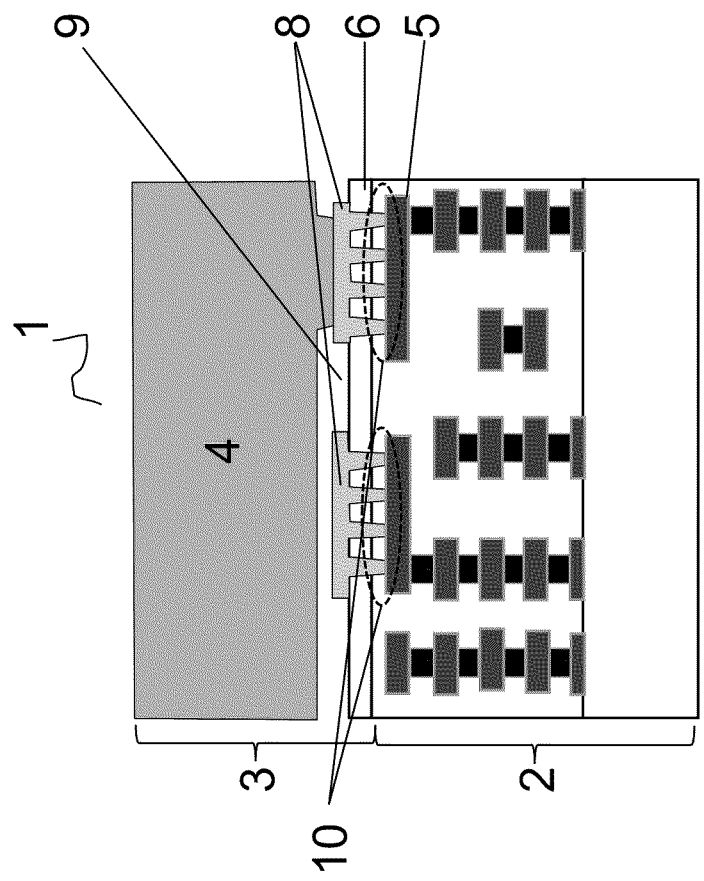
FIG. 1 illustrates a schematic cross-sectional view of a CMOS-MEMS monolithic integration.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third, and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Figure 3:
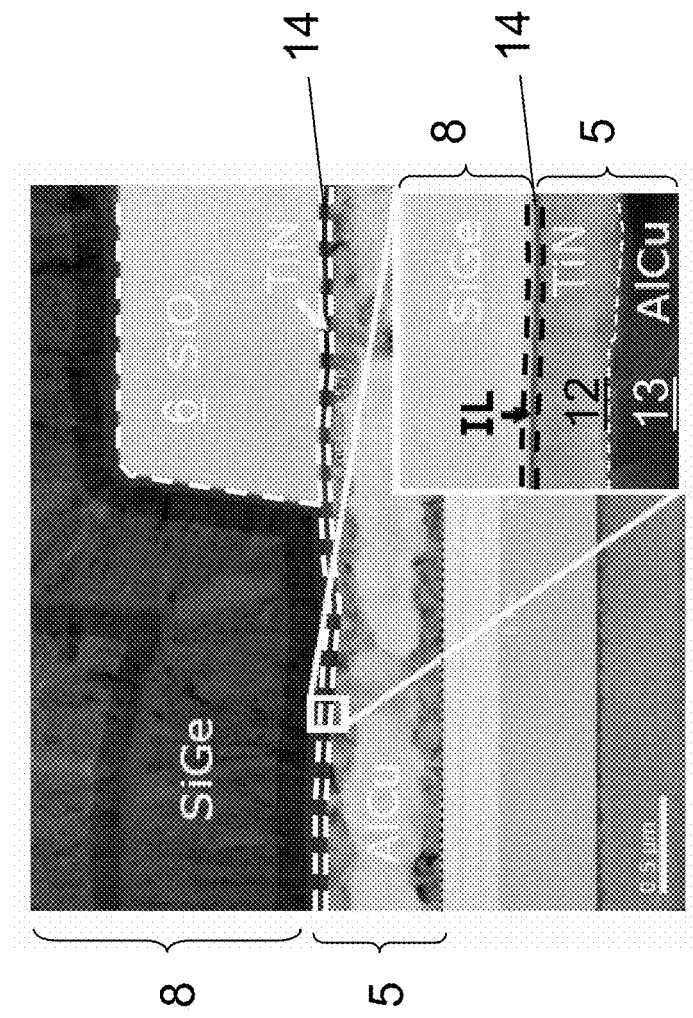
FIG. 3 shows a TEM picture of the non-ohmic contact characterised by FIG. 2.

As show in FIG. 1 an integrated MEMS device 1 comprises a substrate 2 upon which a MEMS device 3 is formed. The SiGe structural layer 4 of the MEMS device 3 is electrically and mechanically connected to the top metal layer 5 via the SiGe MEMS bottom electrode 8. Through an opening 11 (not indicated) in the dielectric layer 6 covering the substrate 2, this CMOS top metal layer 5 is exposed to and contacted by the SiGe MEMS bottom electrode 8. This contact between the metal layer 5 and the SiGe MEMS bottom electrode 8 provides an electrical contact between the electronic circuitry on the substrate 2 and the MEMS device 3 thereby allowing operation of the MEMS device 3 and signal transfer to and from the electronic circuitry. This substrate is typically a CMOS substrate. This contact also serves as a mechanical anchor point for the MEMS device 3 and, as such, will be subjected to substantial mechanical forces during operation of the MEMS device, in particular when the MEMS device 3 contains movable components such as cantilevers which at least partly extend into a cavity 9. These components are formed by patterning the SiGe structural layer 4. Typically the top metal layer 5 is formed as a stack of a TiN layer 12 on an AlCu layer 13 as shown in FIG. 3.

The area of the contact interface 10 between the SiGe layer 4 and the underlying layer 5 should be sufficiently large resulting in reduced contact resistance and increased mechanical strength. This contact area is, however, also dependent on the SiGe deposition process for filling the opening 11 in the dielectric layer 6. A Chemical Vapor Deposition process (CVD) provides a good conformal deposition and a good filing of this opening 11, however at the expense of being time-consuming and is hence expensive. A Plasma Enhanced Chemical Vapor Deposition process (PECVD) allows fast formation of thick layers but results in an incomplete filing of the opening 11 such that keyholes in the centre of the opening 11 are created.

Figure 2:
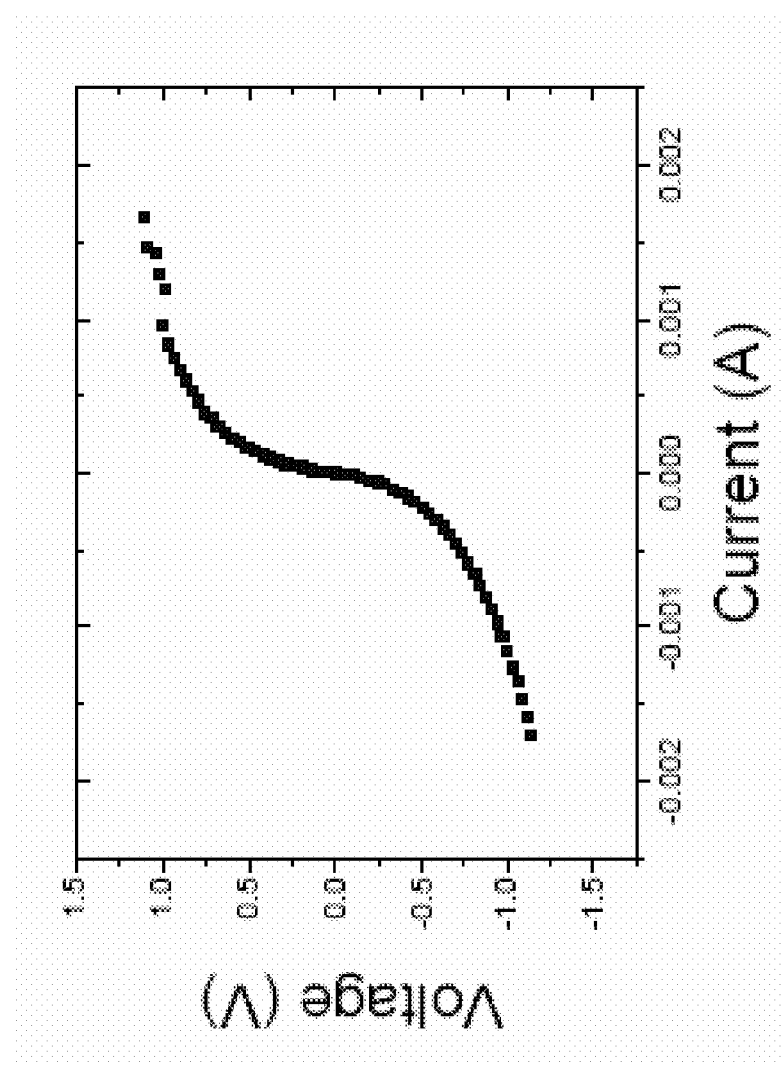
FIG. 2 shows an example of the current-voltage curve of a non-ohmic contact between SiGe and TiN/AlCu metal stack.

To connect the SiGe bottom electrode 8 of the MEMS device 3 to the CMOS top metal 5, an opening 11 through the CMOS passivation layer 6 covering the CMOS top metal 5 is defined by a lithographic patterning step, followed by a reactive ion etch and a resist removal step. The resist removal step typically consists of a wet chemical etch step and a dry etch step which includes the use of an oxygen plasma to remove all organic polymers formed during the reactive ion etch. When exposed to this oxygen plasma, the surface of the contact interface 10 to the CMOS top metal layer 5 can oxidize, resulting in a non-ohmic behavior of the contact as shown in FIG. 2 showing the voltage over and the current through such non-ohmic contact. The oxidized contact interface 10 which was identified by Energy Dispersive X-ray Spectroscopy (EDS) as a mixture of $TiO_2$ and $SiO_2$ can clearly be observed by Transmission Electron Microscopy (TEM) as shown in FIG. 3.

Figure 4:
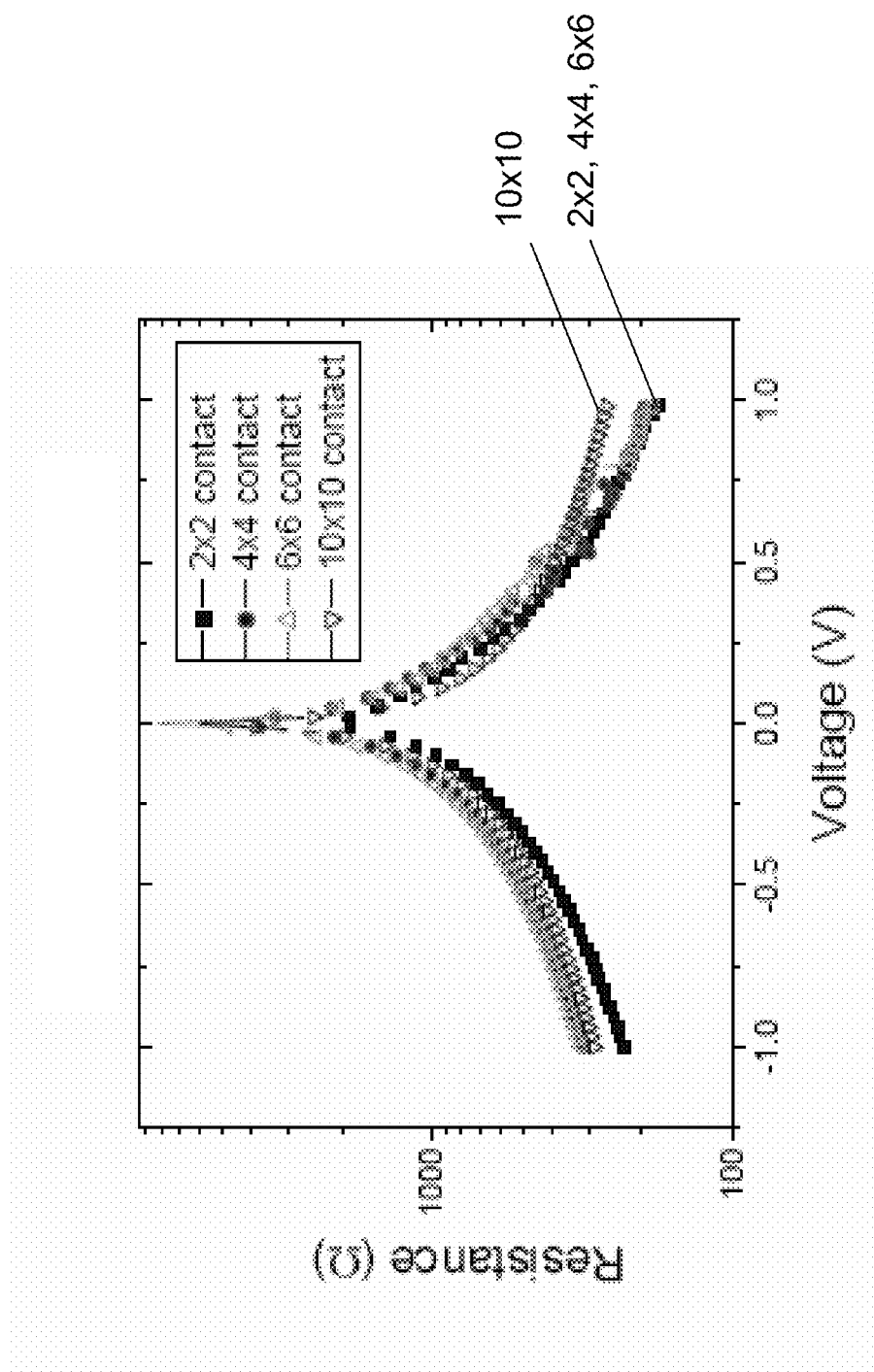
FIG. 4 shows the resistance profile for a contact between a 4 um thick SiGe layer on top of an AlCu layer whereby a HF-dip treatment is performed prior to the deposition of the SiGe layer. The area of the contact was varied: solid square (2 um×2 um), solid circle (4 um×4 um), up triangle (6 um×6 um), down triangle (10 um×10 um).

In a first embodiment a 4 µm thick poly-SiGe layer stack 15 was formed on a metal layer stack 5 of TiN (12)/AlCu (13) through an opening 11 in a dielectric layer 6 covering this metal layer stack 5. The poly-SiGe layer stack 15 was formed by subsequent depositing of 4 layers of SiGe, each SiGe layer being 1 um thick, starting from an amorphous PECVD seed layer. After etching the opening 11 in the dielectric layer 6 and removing the resist of the lithographic patterning step, the poly-SiGe layer stack 15 was either directly deposited or a HF dip was performed prior to the deposition of the poly-SiGe layer stack 15. The contact resistance of the patterned SiGe layer 4, 8 to TiN 12 was studied using cross bridge Kelvin resistor structures with contact sizes ranging from $2 \times 2$ µm$^2$ to $10 \times 10$ µm$^2$. Whether or not a HF dip was performed prior to the deposition of the poly-SiGe layer stack 15, a non-ohmic contact was obtained, even for $10 \times 10$ µm$^2$ contacts as shown in FIG. 4.

Figure 5:
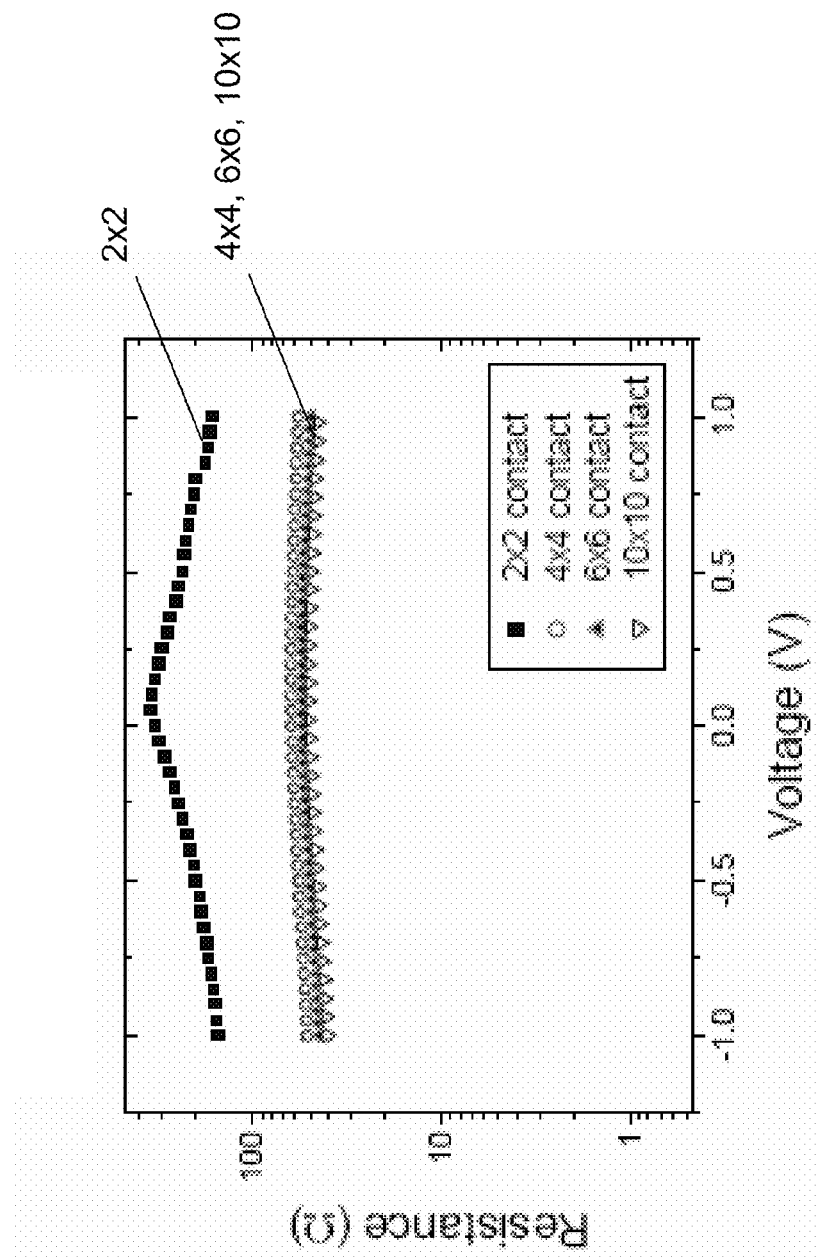
FIG. 5 shows the resistance profile for a contact between a 4 um thick SiGe layer on top of an AlCu layer whereby a HF-dip treatment and H2 plasma is performed prior to the deposition of the SiGe layer. The area of the contact was varied: solid square (2 um×2 um), solid circle (4 um×4 um), up triangle (6 um×6 um), down triangle (10 um×10 um).

In another embodiment a HF dip and a $H_2$-plasma was performed before depositing the poly-SiGe layer stack 15. Here clearly a more clean contact interface 10 was obtained as can be seen in FIG. 5 as the resistance became less dependent on the voltage, but the contact is still non-ohmic. Even if no amorphous seed layer was used to form the poly-SiGe stack 15 the obtained contact resistance remained non-ohmic.

In another embodiment an interface layer 14 was formed prior to the deposition of the poly-SiGe stack 15. After etching the opening 11 in the dielectric layer 6 and removing the resist of the lithographic patterning step, this interface layer 14 was deposited overlying the substrate and contacting the exposed metal stack 5 and the sidewalls of the opening 11. Then the poly-SiGe layer stack 15 was deposited. A thin Ti—TiN (5/10 nm) layer stack and a thin Ta—TaN (5/10 nm) layer stack were tested as interfacial layer 14, whereby first Ti, respectively Ta, was deposited followed by the deposition of TiN, respectively TaN. Optionally different $B_2H_6$ precursor flows were used during the 400 nm SiGe CVD deposition 15. Optionally a soft sputter etch (SSE) step on the exposed metal layer 5 was performed before depositing the interface layer 14. Table 1 summarizes the different process conditions.

TABLE 1

Split table for the interfacial layer approach

| | 0 nm SSE + Ti—TiN | 10 nm SSE + Ti—TiN | 20 nm SSE + Ti—TiN | 20 nm SSE + Ta—TaN |
|---|---|---|---|---|
| 20 sscm $B_2H_6$ | | | X | |
| 40 sscm $B_2H_6$ | X | X | X | X |
| 50 sscm $B_2H_6$ | | | X | |

Figure 6:
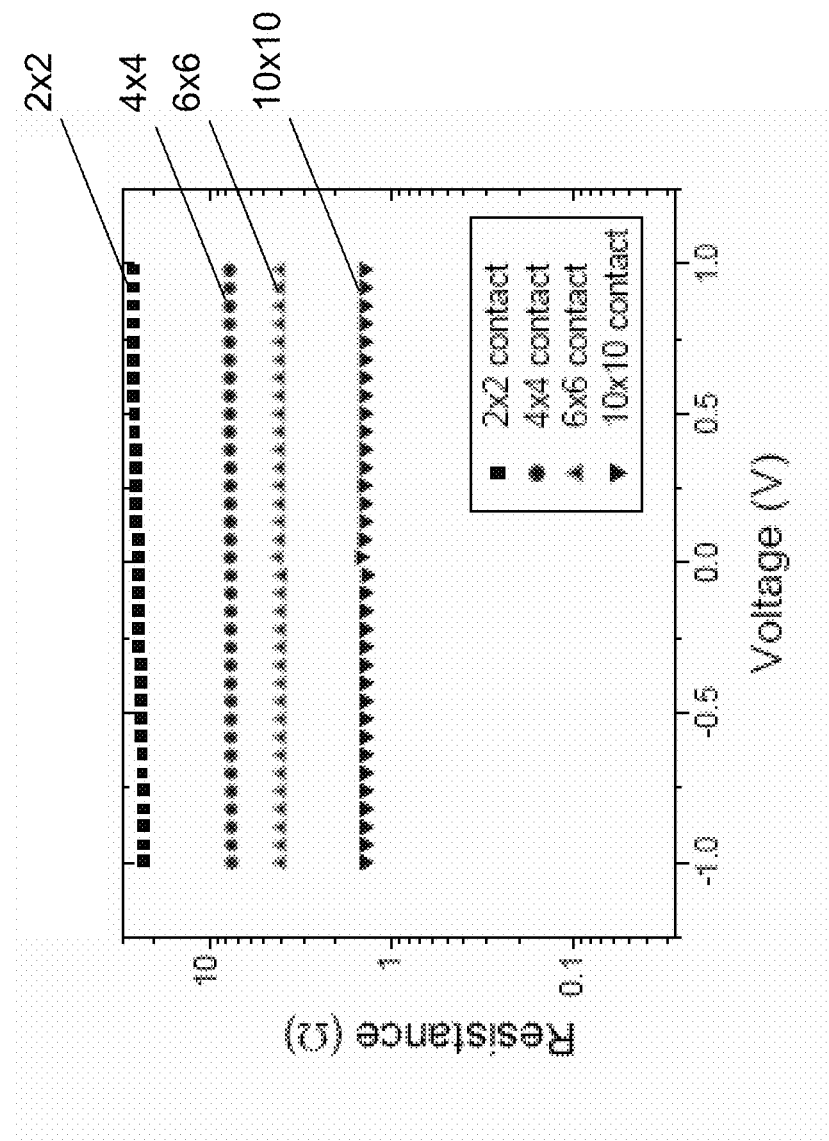
FIG. 6 shows the resistance profile for a contact between a 4 um thick SiGe layer on top of an AlCu layer whereby a TiN/Ti interface layer is present between the SiGe and AlCu layer. The area of the contact was varied: solid square (2 um×2 um), solid circle (4 um×4 um), up triangle (6 um×6 um), down triangle (10 um×10 um).

Almost all of these test conditions resulted for the TiN/Ti interface layer stack 14 in ohmic contacts as shown in FIG. 6. Only the Ta—TaN option resulted in a slightly non-ohmic behaviour making it a less preferred solution. TaN is known to oxidize much faster than TiN. As TiN and TaN are deposited in a different deposition tool than SiGe 15, the TaN interfacial layer can oxidize during the transfer to the SiGe deposition tool. If however SiGe 15 can be deposited on the TaN/Ta interfacial layer 14 without intermediate exposure to an oxygen containing ambient, oxidation of the TaN layer can be avoided and hence a good ohmic contact can be obtained.

Figure 7:
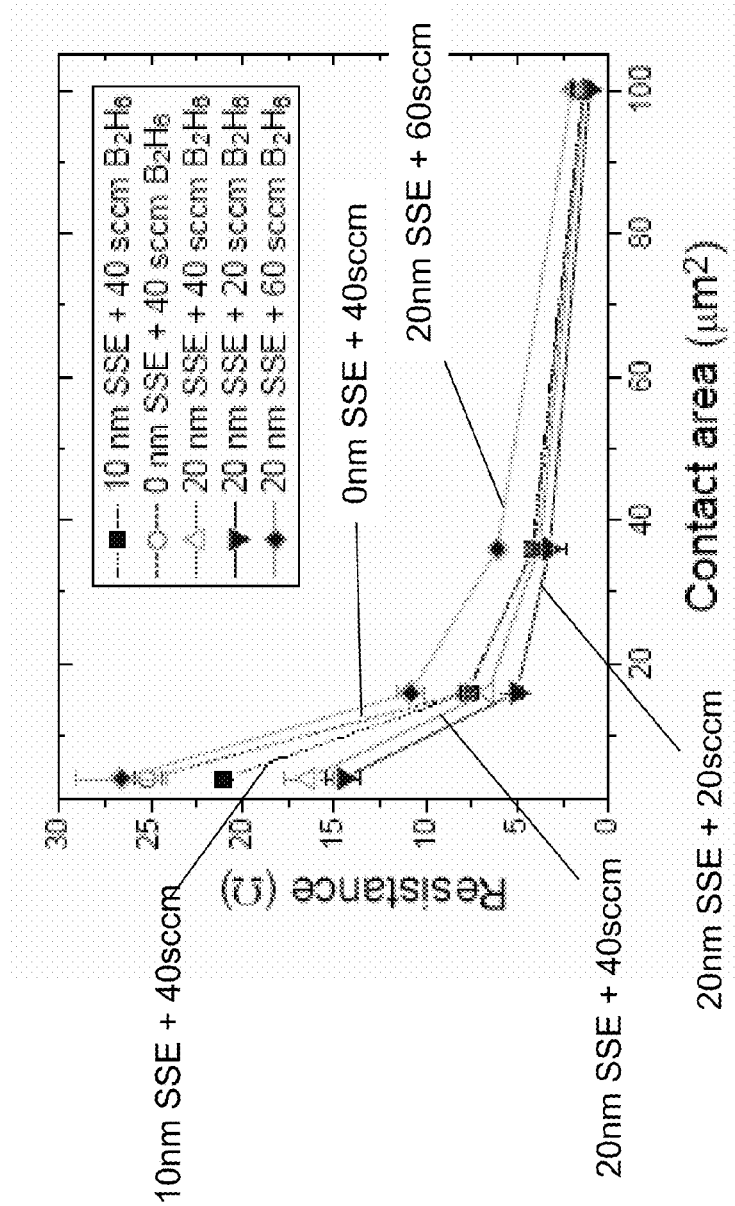
FIG. 7 shows the resistance profile for a contact between a 4 um thick SiGe layer on top of an AlCu layer as function of the contact area whereby a TiN/Ti interface layer is present between the SiGe and AlCu layer: solid square (2 um×2 um), solid circle (4 um×4 um), up triangle (6 um×6 um), down triangle (10 um×10 um). Different experimental conditions were used to form the interface as listed in table 1.

The impact of the soft sputter etch and/or the composition of the gas flow during the SiGe 15 deposition process was further examined in case of a TiN/Ti interfacial layer 14. A soft sputter etch is a low DC power sputtering process using an Ar plasma whereby a surface is cleaned. A soft sputter etch is characterised by an equivalent amount of oxide loss. In the experimental conditions used, the parameters of this soft sputter etch cleaning step were selected to obtain 0 nm, 10 nm or 20 nm oxide loss. The electrical resistance for the different process conditions and contact areas are shown in FIG. 7. It can be seen that the soft sputter etch improves the contact interface. Lowering the $B_2H_6$ precursor flow during the formation of the SiGe layer 15 from 60 to 20 sccm also results in a lower contact resistance. A higher $B_2H_6$ flow results in smaller grained SiGe and thus an increased number of grain boundaries. The obtained contact resistivity is lower than the one achieved by the Ni-silicide processing used by Eyoum et al. in "Low-Resistance Silicon-Germanium Contact Technology for Modular Integration of MEMS with Electronics", Journal of Electrochemical Society, 151 (3) J21-J25 (2004), for all contact sizes ($6.2 \pm 0.4 \times 10^{-7}$ $\Omega cm^2$ compared to $9 \pm 4 \times 10^{-7}$ $\Omega cm^2$ for a $2 \times 2$ $\mu m^2$ contact) for the given SiGe composition deposited at 450° C.

Figure 8:
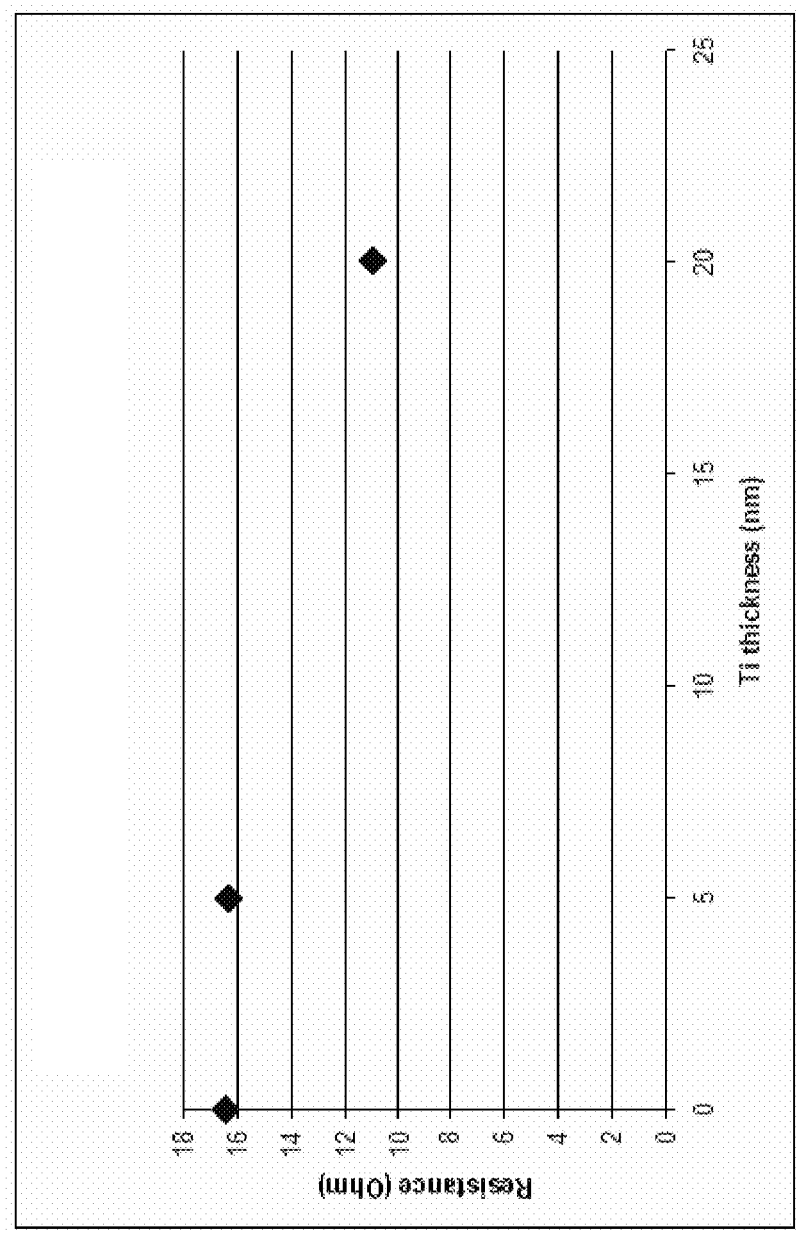
FIG. 8 shows the dependency of the contact resistance as a function of the Ti thickness in the interface layer for 10 nm TiN and a preceding soft sputter etch of 20 nm for 2 um×2 um contact.

FIG. 8 shows the dependency of the contact resistance as function of the Ti thickness in the interface layer 14 for 10 nm TiN and a preceding soft sputter etch of 20 nm for a 2 um×2 um contact and 40 sccm $B_2H_6$. If no Ti or only a thin Ti layer 17 is deposited prior to the deposition of the TiN layer 18, the contact resistance is already low when using an adequate soft sputter etch, i.e. minimal 20 nm oxide removal. If the thickness of the Ti layer 17 is increased above 10 nm, the contact resistance drops even further.

Figure 9:
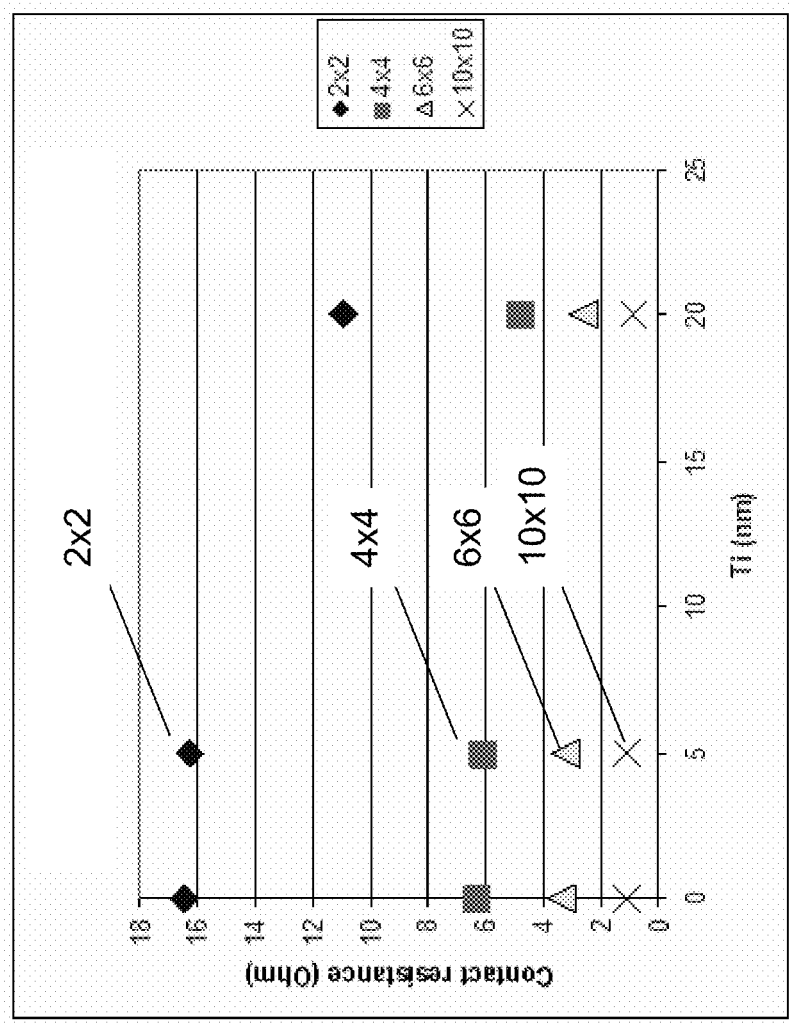
FIG. 9 shows, for different contact sizes, the dependency of the contact resistance as a function of the Ti thickness in the interface layer for 10 nm TiN and a preceding soft sputter etch of 20 nm with a 40 sscm $B_2H_6$ flow during the deposition of the SiGe layer. Contact sizes are 2 um×2 um (diamond), 4 um×4 um (square), 6 um×6 um (triangle), 10 um×10 um (cross).

FIG. 9 shows, for different contact sizes, the dependency of the contact resistance as a function of the Ti thickness 17 in the interface layer 14 for 10 nm TiN 18 and a preceding soft sputter etch of 20 nm with a 40 sscm $B_2H_6$ flow during the deposition of the SiGe layer. Contact sizes are 2 um×2 um (diamond), 4 um×4 um (square), 6 um×6 um (triangle), 10 um×10 um (cross). The same trend is seen as in FIG. 8, the drop in contact resistance with increasing Ti layer 17 thickness being less pronounced with increasing contact size.

Figure 10:
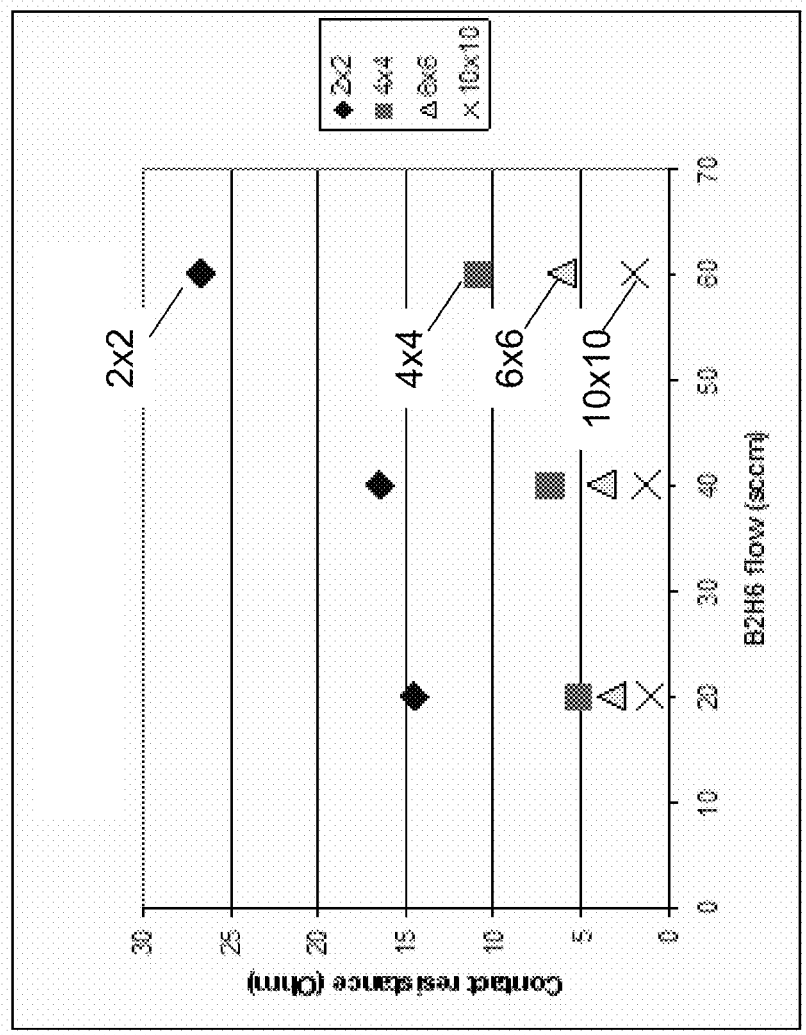
FIG. 10 shows, for different contact sizes, the dependency of the contact resistance as a function of the $B_2H_6$ flow during the deposition of the SiGe layer. The interface layer was 10 nm TiN on 5 nm Ti stack. Contact sizes are 2 um×2 um (diamond), 4 um×4 um (square), 6 um×6 um (triangle), 10 um×10 um (cross).

After the deposition of the interface layer 14 the B-doped SiGe layer 15 is deposited whereby the $B_2H6$ flow can be tuned to further reduce the contact resistance. FIG. 10 shows, for different contact sizes, the dependency of the contact resistance as function of the $B_2H_6$ flow during the deposition of the SiGe layer. The interface layer was 10 nm TiN 18 on 5 nm Ti stack 17. Contact sizes are 2 um×2 um (diamond), 4 um×4 um (square), 6 um×6 um (triangle), 10 um×10 um (cross). With increasing $B_2H_6$ flow during the deposition of the SiGe layer, the contact resistance will increase. This effect is more pronounced for smaller contacts.

Figure 11:
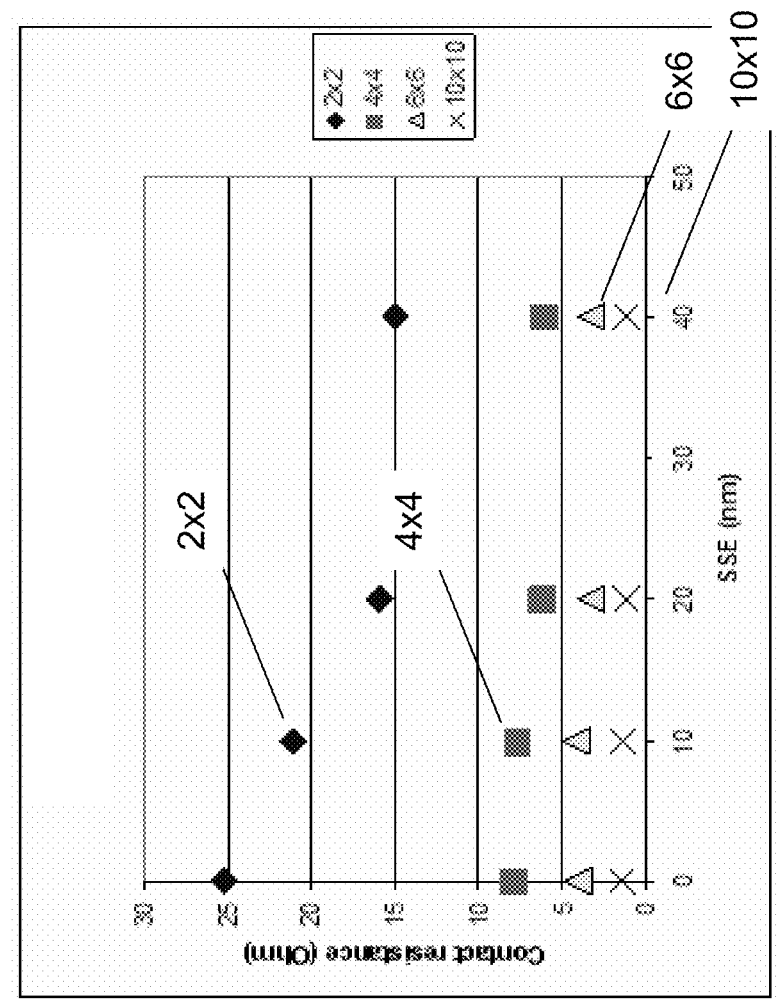
FIG. 11 shows, for different contact sizes, the dependency of the contact resistance as a function of the soft sputter etch removal. The interface layer was 10 nm TiN on 5 nm Ti stack with a 40 sscm $B_2H_6$ flow during the deposition of the SiGe layer. Contact sizes are 2 um×2 um (diamond), 4 um×4 um (square), 6 um×6 um (triangle), 10 um×10 um (cross).

FIG. 11 shows, for different contact sizes, the dependency of the contact resistance as function of the soft sputter etch removal. The interface layer 14 was 10 nm TiN 18 on 5 nm Ti stack 17 with a 40 sccm $B_2H_6$ flow during the deposition of the SiGe layer. Contact sizes are 2 um×2 um (diamond), 4 um×4 um (square), 6 um×6 um (triangle), 10 um×10 um (cross). With increasing soft sputter etch removal the contact resistance will drop. This effect is more pronounced for smaller contacts. The maximum soft sputter etch removal is defined by the extent to which the exposed layers, such as the dielectric in which the opening is, may be affected.

FIGS. 12(a)-12(f) illustrate by means of schematic cross-sectional views a sequence of process steps of a process flow for manufacturing a low resistance contact between SiGe and another layer such as metal layer or a SiGe layer as disclosed in the other embodiments. A "SiGe layer" is a layer having a composition $Si_xGe_y$ with $0<x+y<1$. This layer can be doped (n or p-type) or undoped.

Figure 12A:
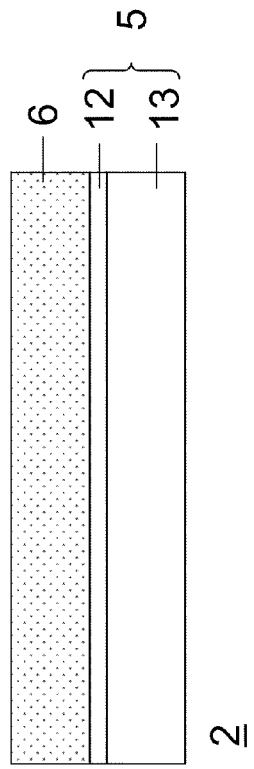
FIGS. 12(a)-12(f) illustrate a sequence of process steps in the manufacturing of MEMS devices having low resistance contacts.

A substrate 2 comprising a metal layer stack 5 covered with a dielectric layer stack 6 is provided as shown in FIG. 12(a). The metal stack 5 can consist of a TiN layer 12 on top of an AlCu layer 13. The TiN layer 12 is used as an antireflective coating during lithographic processing. The dielectric layer stack 6 can be a single oxide layer. Optionally additional dielectric layers can be present in this dielectric layer stack 6. For example a SiC layer can be formed on a silicon-oxide layer as such SiC layer provides a better sealing of the underlying substrate 2 compared to silicon-oxide.

Figure 12B:
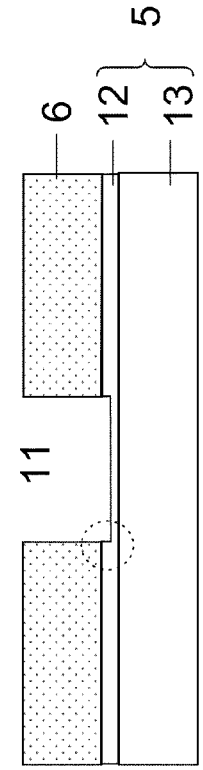

Using lithographic patterning an opening 11 is created in the dielectric layer stack 6 thereby exposing part of the metal stack 5 as shown in FIG. 12(b). During the dry etching of the dielectric stack 6 also part of the metal stack 5 can be removed. If e.g. the metal stack 5 is a stack of a TiN layer 12 on an AlCu layer 13, then part of the TiN layer 12 can be etched depending on the process conditions of the dry etch step. This is illustrated in FIG. 12(b) where the thickness of the TiN capping layer is less in the opening 11 compared to the thickness underneath the dielectric stack 6. This reduced TiN thickness might decrease the diffusion barrier properties of the TiN capping layer 12 such that e.g. during manufacturing of the integrated CMOS-MEMS device 1 Si and/or Ge diffuses from the SiGe layer 8 to the metal layer 13.

Figure 12C:
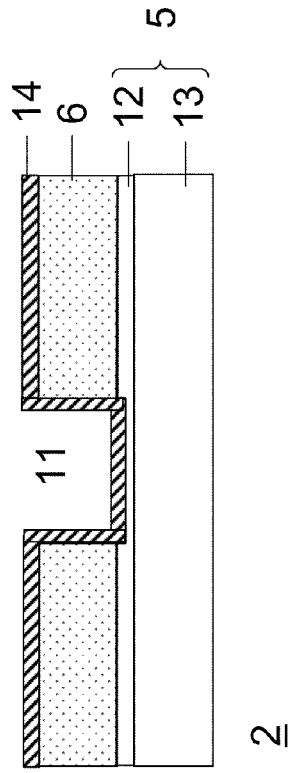
Figure 12D:
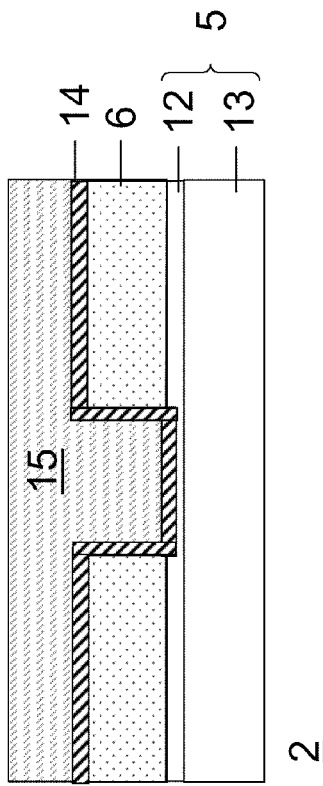
Figure 12E:
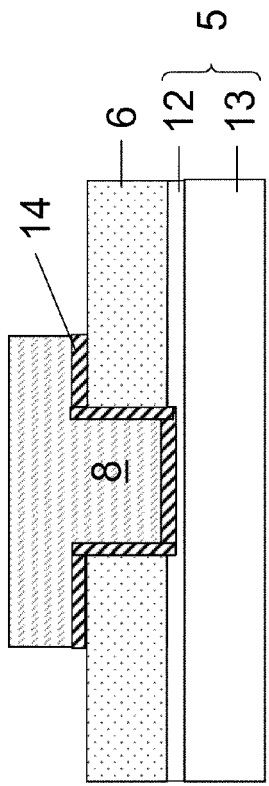
Figure 12F:
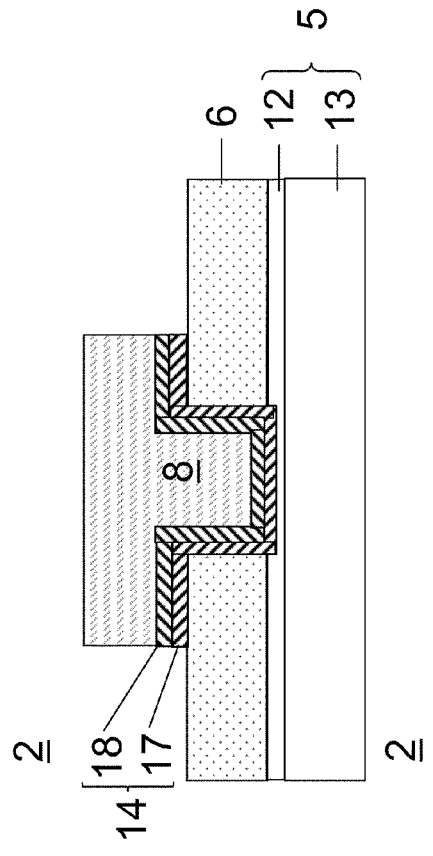

Overlying the substrate an interface layer 14 is formed as shown in FIG. 12(c). This interface layer 14 covers at least the metal stack 5 exposed at the bottom of the opening 11 and also the sidewalls of the opening 11. Preferably this layer is conformally formed, e.g. by Chemical Vapour Deposition (CVD), but also other methods e.g. Physical Vapour Deposition (PVD) can be used. This interface layer 14 can be a single layer of TiN or TaN as shown in FIGS. 12(c)-12(e). This interface layer 14 can be a stack of TiN—Ti layer whereby the TiN layer 18 is in contact with the SiGe layer 8 and the Ti layer 17 is in contact with the metal layer stack 5. This interface layer 14 can be a stack of TaN—Ta layer whereby the TaN layer 18 is in contact with the SiGe layer 8 and the Ta layer 17 is in contact with the metal layer stack 5. A two-layered interface layer is illustrated by FIG. 12(f), whereby the top layer 18, e.g. respectively TiN or TaN is in contact with the silicon-germanium layer 8, while the bottom layer 17, e.g. respectively Ti and Ta is in contact with the underlying layer stack 5 to form a TiN/Ti or a TaN/Ta interface layer 14.

Before forming the interface layer 14 additional cleaning steps can be performed to remove residues from within the opening 11. These additional cleaning steps can comprise a soft sputter etch and/or a $H_2$ plasma. In particular when the interface layer 14 only consist of a TiN or TaN layer, then preferably these additional cleaning steps are performed to further reduce the contact resistance and improve the uniformity of the resistance over the substrate.

Thereafter the SiGe layer 15 is formed on the interface layer 14, e.g. by Chemical Vapour deposition. As can be seen in FIG. 12(d) the SiGe layer 15 is now spaced apart from the AlCu layer 13, not only by the thinned capping layer 12, but also by the interface layer 14 such that an increased diffusion barrier is obtained. If TaN is used to form the interface layer 14, then care must be taken not to expose the deposited interface 14 to an oxidizing ambient as TaN might be partially oxidized. Preferably after the deposition of the TaN interface layer 14 the substrate is transported in a non-oxidizing ambient to the SiGe deposition tool or, if this is not possible, an additional cleaning step is done prior to the SiGe deposition step to remove the oxidized TaN.

The SiGe layer 15 is lithographically patterned together with the interface layer 14 to form the SiGe bottom electrode 8. As the thickness of the interface layer 14 is limited, removal of the interface layer 14 from underneath the SiGe bottom electrode 8 during subsequent MEMS processing is unlikely to have a substantial impact on the MEMS device integrity. The interface layer will have a thickness typically in the range of 10 to 35 nm, preferably 10 to 20 nm. If an interface bilayer 14 is used, e.g. TiN on Ti or TaN on Ta, the TiN respectively TaN layer 18 will have a thickness typically in the range 5 to 15 nm while the Ti respectively Ta layer 17 will have a thickness typically in the range of 0 to 20 nm, preferably 5 to 10 nm. This unwanted etching of the patterned interface layer 14 can occur when removing the sacrificial layer of the MEMS device thereby releasing the structures formed in the SiGe MEMS structural layer 3. The unwanted etching was however not found when sticking to the thickness limits for Ti (or Ta) and TiN (or TaN) described above.

As shown in FIG. 12(e) the silicon-germanium layer 8 is separated from the underlying layer 5 by a dielectric layer stack 6, except at the location of the opening 11. An electrical contact between both layers is established by creating an opening 11 in this dielectric stack 6 through which opening a part of the underlying layer 5 is exposed. An interface layer 14 separates the silicon-germanium layer 8 from the dielectric layer stack 6 at least in the openings and from the underlying layer 5.

Figure 13:
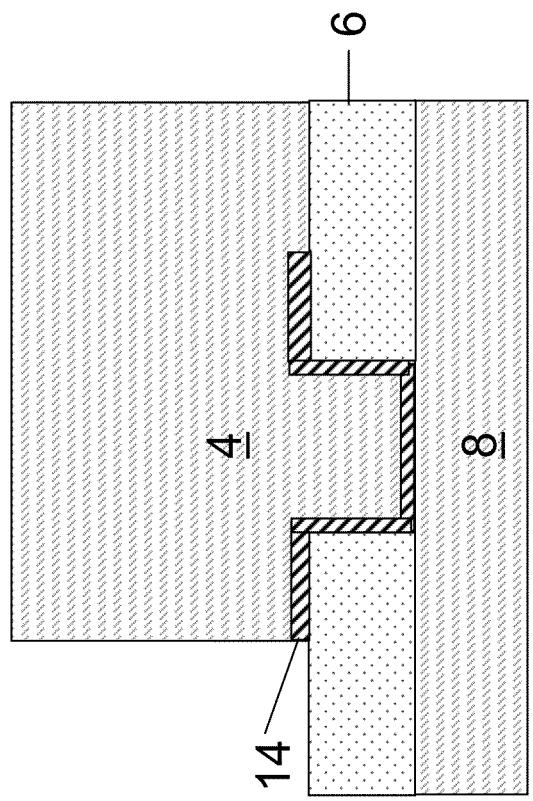
FIG. 13 shows a schematic drawing of a contact between two SiGe layers separated by an interface layer.

FIGS. 12(a)-(f) illustrate the process for improving the contact between a SiGe layer, here a bottom electrode 8, and an underlying layer 5 by inserting the interface layer 14. As shown in FIG. 13 this interface layer 14 can also be inserted in between two SiGe layers, here a SiGe structural layer 4 connected to a SiGe electrode 8 through an opening in a dielectric layer stack 6. In this Figure the SiGe bottom electrode and the SiGe structural layer 4 are formed using different SiGe layers 15.

This dielectric stack 6 can be an oxide layer, such as silicon oxide, to separate a silicon-germanium structural layer 4 from an underlying silicon-germanium electrode 8. This dielectric stack 6 can be a stack of HF-resistant layer, such as silicon carbide or silicon nitride, formed on an oxide layer, such as silicon-oxide to separate the silicon-germanium layer 8 from an underlying metal layer 5, e.g. from a CMOS interconnect pattern. The upper layer in the dielectric stack 6 then provides a hermetic sealing of the CMOS substrate 2.

In another embodiment an integrated CMOS-MEMS device for probe storage device application is disclosed. In this embodiment the Ti/TiN layer 14 not only improved the contact resistance between metal 5 and SiGe bottom electrode 8 when it was used in between metal 5 and electrode 8, but also lowered the cantilever deflection and improved the adhesion of the cantilever to the bottom electrode during release when it was used between the SiGe electrode 8 and the SiGe structural layer 4.

The demand for high capacity, low power, ultra compact and high performance storage has generated significant interest over the last five years in scanning probe microscopy based storage systems. Different read/write mechanisms based on 2-D arrays of cantilevers equipped with sharp tips and several storage media have been investigated. Thermomechanical, piezoelectric-mechanical, or ferroelectric storage systems have demonstrated several Tbits/sq.inch capacity and acceptable read/write speed in the order of kb/s per tip. Phase change media has also been proposed and attempted, but requires a cover layer for protection of the active media layer that does not spread the read or write current. The drawback of thermo or piezoelectric read/write mechanisms is related to scalability of both data density and power consumption. The ferroelectric probe storage system, on the other hand, uses an electric field to switch the polarity of domains locally in a ferroelectric media to enable the bit writing. This field switching does not require generating and regulating heat and/or current so that the process of writing of ferroelectric bit consumes a relatively low power. The fast (100 kbps) writing of an array of ferroelectric bits with size smaller than 20 nm and pitch smaller than 40 nm can be achieved with an electric field switching process. A recently developed non-destructive reading method demonstrated the high-speed (cm/s) detection of electrical charges associated with bits using scanning probe.

All storage devices face a challenge of keeping an adequate signal-to-noise ratio while decreasing size of the bits and increasing data density. It is desirable to have read-write channel electronics located as close to the read-write head as possible to maximize the signal-to-noise ratio. In probe storage devices this critical requirement can be satisfied by integrating an array of MEMS-based cantilevers with sharp tips, which work as read-write heads, and CMOS read-write channel circuitry on the same wafer thereby constructing a CMOS-MEMS monolithic integrated device. A complete surface micromachining technology and process flow that can enable the complete fabrication of CMOS-integrated cantilever array for an "electrical current" probe storage system is presented in the paragraphs below.

This technology utilizes a CMOS-compatible material—silicon-germanium (SiGe)—deposited at maximum temperature of 450° C. and a low-temperature process compatible with a CMOS-first approach for fabrication of the cantilevers with tips integrated with an electrical read/write system. Hence the MEMS device 3 is processed on CMOS substrate 2. Probe storage devices require extensive CMOS circuitry to address each cantilever, as part of a large array, both for actuation and for signal processing/coding. The possibility to fabricate cantilevers directly on top of the last CMOS metallization 5 leads to an ultra compact solution for the probe storage system. Parasitic circuit parameters can also be minimized so that signal to noise ratio as well as sensitivity during read operation is improved.

A dual-thickness cantilever structural layer 4 is implemented to achieve both low torsional stiffness and high flatness of the cantilevers. Not only vertical but also lateral actuation is provided to the individual cantilevers in order to guarantee simultaneous precise tip to medium positioning of multiple cantilevers during write/read operations within a wide range of operating temperatures. Particular attention has been given to the reduction of the cantilever actuation voltage in order to relax the specification for the actuation voltages controlling both the vertical and lateral cantilever displacement. An electrical connection is provided to the tip from the CMOS by a partially suspended and isolated Pt line (trace), running on top of the cantilever surface. This unique part of the read/write system can be simultaneously optimized for both read and write operations.

Process Description

Figure 14:
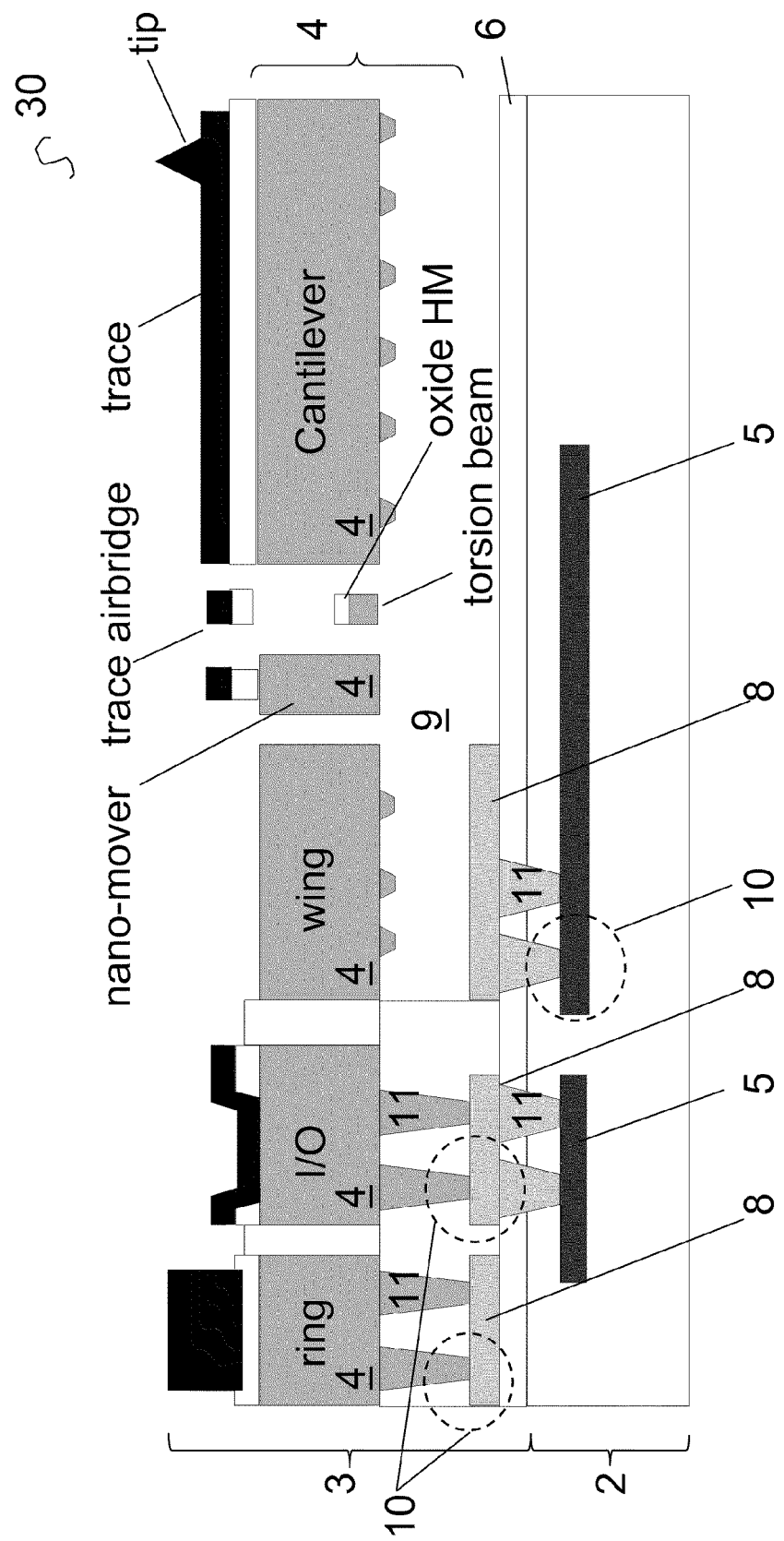
FIG. 14 shows a schematic drawing of a cantilever process flow with main materials and structural components.

A schematic overview of the cantilever/tip/trace 30 process flow is illustrated by FIG. 14.

The process starts on top of the last CMOS metallization 5. This metal level 5 is the top metal level of the interconnect pattern of the CMOS substrate 2. It is typically composed of a TiN layer 12 on top of an Al layer 13. The interconnect pattern is a stack of dielectric and conductive layers 22 electrically connected to each-other through openings 21 in the dielectric layers. Through this interconnect pattern active devices in the CMOS substrate 2 can be connected to each-other or to a MEMS device 3 on top of the CMOS substrate 2. The substrate 2 wafer surface is planarized using chemical-mechanical polishing (CMP) of high density plasma (HDP) oxide and then covered by a 400 nm thick SiC layer to form the dielectric stack 6. This insulator is impermeable to HF molecules and is therefore used to protect the CMOS substrate 2 during vapour HF (VHF) etching step—the final step of the process, which is used to remove the sacrificial oxide layer and release the cantilever array formed by the pattern in the SiGe structural layer 4.

The SiC layer in the dielectric stack 6 is perforated and the vias 11 filled in with conformal SiGe deposition 15 connecting each cantilever 4 to the metal layer 5 underneath. Patterning of the deposited SiGe layer 15 defines inter alia SiGe electrodes 8 for vertical actuation of cantilevers 4.

A well-controlled deposition of HDP sacrificial oxide layer defines a 3 μm gap 9 in the final structure. Both shallow trenches ("dimples") and vias 11 are formed in the sacrificial oxide layer. The dimples create topography on top surface of the sacrificial oxide layer resulting in topography of the bottom surface of the cantilever formed thereon and prevent stiction during release and actuation. The vias 11 are used for anchoring cantilevers to the electrodes 8.

Deposition of the 3 μm thick SiGe 15 structural layer on the sacrificial oxide layer is broken into two steps because a 250 nm oxide hard mask (oxide HM) is embedded in the SiGe structural layer to define the torsion suspension beams. When patterning the deposited SiGe layer to form the structural layer 4 the oxide HM protects a portion of SiGe layer 15 allowing for the definition of 1 μm thick torsion beams and 3 μm thick body of cantilever as well as the lateral actuator ("nanomover"). Using Chemical Mechanical Polishing (CMP) steps ensures flatness of the wafer surface after the deposition steps.

The sharp tips and traces connecting the tips to the CMOS circuitry are then built up on top of the cantilevers. Oxide trench filling and CMP provide a flat surface for the formation of the tip and Pt trace. Note that a thick SiC layer on top of the structural layer isolates the mechanical cantilever from the traces.

A Ni/Au pattern can be formed for bonding the CMOS/cantilever wafer 1 to another MEMS wafer containing an X-Y scanner with a layer of memory material.

Finally the oxide supporting the structural layer 4 and the elements formed therein, e.g. cantilever, wing, nanomover, as well as filling the openings in this structural layer 4 is removed, thereby releasing the structural layer 4.

Process Optimization

Figure 15:
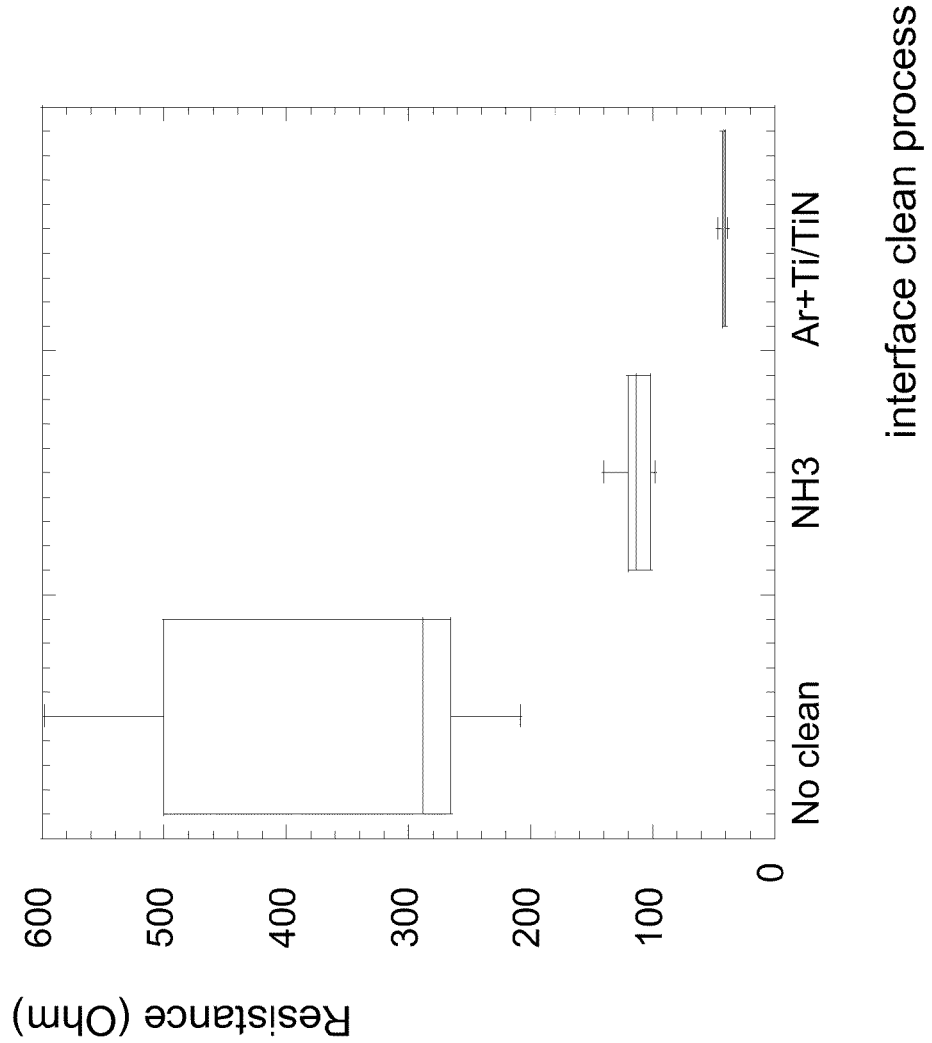
FIG. 15 shows MEMS-via resistance values, including within wafer variation for 0.8 um×0.8 um square contacts, for various contact interface clean processes before SiGe deposition.

The interface between the metal layer 5 and the SiGe electrode 8, as shown in FIG. 14, has been optimized to reach a low contact resistance while preserving the impermeability of the SiC layer of the dielectric stack 6 towards HF. The latter can be obtained only if the interface between SiGe and SiC layer of the dielectric stack 6 is oxygen free. However, an oxygen flow, used to remove resist after via to metal 5 patterning, heavily oxidizes the first 10 nm of exposed SiC layer of the dielectric stack 6. This oxidized SiC layer of the dielectric stack 6 is removed with diluted HF and a soft sputter etch-clean, e.g by using an Ar plasma, prior to SiGe 15 deposition. An Ar clean is also used to remove the oxidized TiN 12 on top of the Al 13 metal 5 layer, which leads to, as shown in FIG. 12(b), a locally thinner diffusion barrier. As shown in FIG. 15 this SiGe deposition process, preferably including the proposed cleaning sequence, combined with a Ti/TiN interface layer 14 gives the lowest contact resistance value of $2.5 \times 10^{-7}$ Ω-cm$^2$, comparable to the best achieved literature results. Note that by proper interface optimization the within wafer uniformity (8" wafers) of contact resistance can be greatly improved as shown in FIG. 15.

Figure 16:
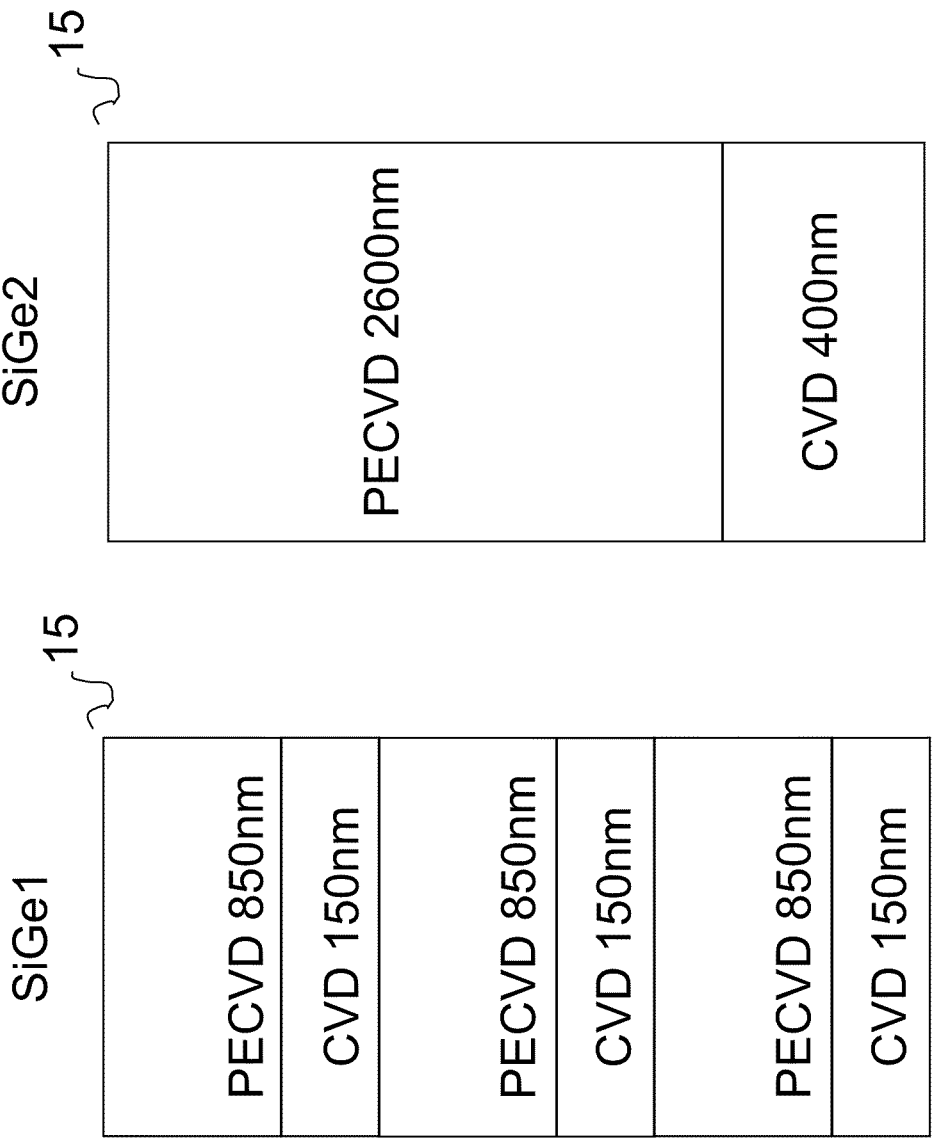
FIG. 16 shows a schematic representation of two different SiGe layer deposition processes labelled SiGe1 and SiGe2.
Figure 17:
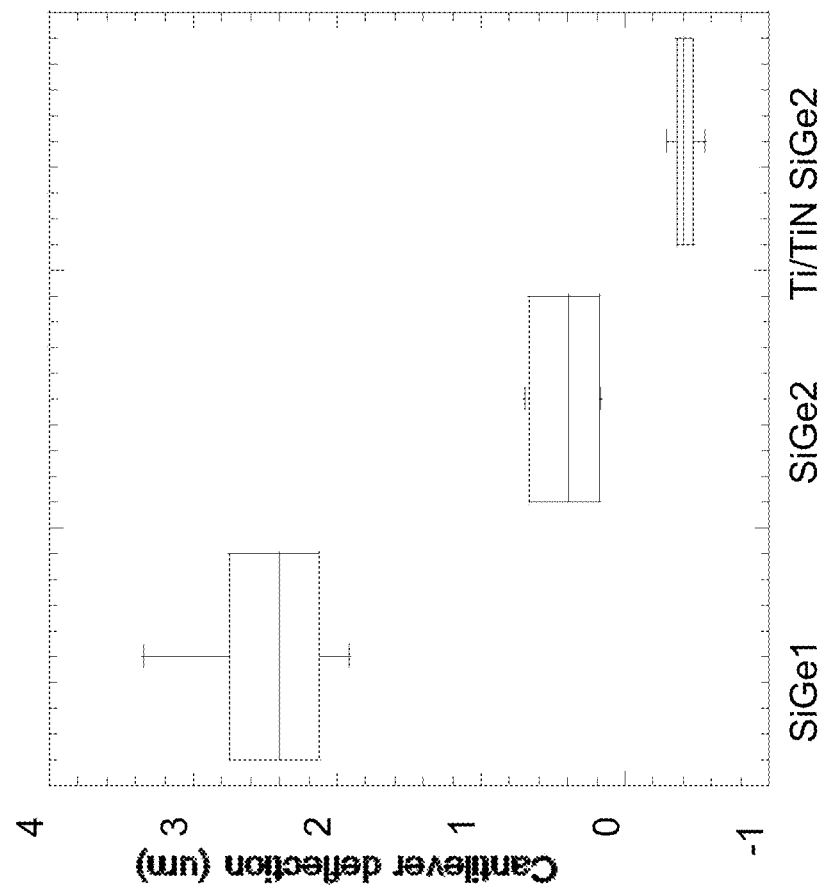
FIG. 17 shows the within wafer variation of cantilever deflection versus combination of CVD/PECVD SiGe deposition processes.

The deposition of the SiGe 15 for the structural layer 4, is optimized to minimize the deposition time (cost and cycle time) and the material strain gradient. FIG. 16 illustrates two deposition sequences SiGe1 and SiGe2 for forming this SiGe layer 15. In the SiGe2 sequence, first, a 400 nm thick SiGe conformal chemical vapor deposition (CVD) of boron doped SiGe is performed to completely fill the anchor openings 11 to the electrode 8. This ensures good structural stability and layer adhesion, and guarantees SiGe crystal nucleation and growth on top of the oxide substrate. Second, plasma enhanced CVD (PECVD) having a high deposition rate is used to complete the 3 μm thick layer. This solution was preferred over the stacking of multiple CVD and PECVD depositions, as proposed by sequence SiGe1, as for the SiGe2 sequence the total deposition time is lower and the SiGe within wafer uniformity is improved, as indicated in FIG. 17. Furthermore understanding and optimization of the stress and strain gradient of the layer are significantly simplified, leading to strain gradient values down to $2 \times 10^{-5}$/μm for 2 μm thick layers.

Note that the optimized SiGe layer SiGe2 is preceded by a thin Ti/TiN adhesion layer 14 to prevent cantilever delamination during release by providing an interface with increased mechanical strength even for small contact openings 11. This preferred combination of deposition process, predeposition cleaning sequence, and interface layer 14 not only yields very good thickness uniformity over the wafer but a very low initial deflection of the cantilever with a very good uniformity.

As shown above, similar to the low-resistance contact between a SiGe 15 layer and another layer, i.e. a metal layer 5, illustrated by FIG. 12(c), also for a contact between a SiGe 4 layer and another layer, i.e. a SiGe layer 8, an interface layer 14 can be inserted between both SiGe 4, 8 layers. The dotted circles in FIG. 14 identify locations where two layers are contacted 10, the upper layer being SiGe 8, 4 while the lower layer can be a metal layer 5 or a semiconductor layer 8 such as SiGe, respectively.

This interface layer 14 covers at least the layer 5, 8 exposed at the bottom of the opening 11 and also the sidewalls of the opening 11. Preferably this layer is conformally formed, e.g. by Chemical Vapour Deposition (CVD), or by PVD. This interface layer 14 can be a single layer of TiN or TaN. This interface layer 14 can be a stack of TiN—Ti layer whereby the TiN layer is in contact with the SiGe layer 8 and the Ti layer is in contact with the metal layer stack 5. This interface layer 14 can be a stack of TaN—Ta layer whereby the TaN layer is in contact with the SiGe layer 8 and the Ta layer is in contact with the metal layer stack 5.

Hence the another layer is preferably a conductive layer such as a metal layer, e.g. Al, TiN or a semiconductive layer such as SiGe.

Before forming the interface layer 14 additional cleaning steps can be performed to remove residues from within the opening 11. These additional cleaning steps can comprise a soft sputter etch and/or a H$_2$ plasma. In particular when the interface layer 14 only consists of a TiN or TaN layer, then preferably the additional cleaning steps are performed to further reduce the contact resistance and improve the uniformity of the resistance over the substrate.

Thereafter the SiGe layer 15 is formed on the interface layer 14, e.g. by Chemical Vapour Deposition. The patterned SiGe layer 8 is now spaced apart from the underlying layer AlCu layer 13, not only by the thinned capping layer 12, but also by the interface layer 14 such that an increased diffusion barrier is obtained. If TaN is used to form the interface layer 14 then care must be taken not to expose the deposited interface 14 to an oxidizing ambient as TaN might be partially oxidized. Preferably after the deposition of the TaN interface layer 14 the substrate is transported in a non-oxidizing ambient to the SiGe deposition tool or, if this is not possible, an additional cleaning step is done prior to the SiGe deposition step to remove the oxidized TaN.

Processing Results

Different designs have been introduced to vary the cantilever mass, changing the mechanical behaviour of the cantilever.

The invention claimed is:

1. A MEMS device comprising a silicon-germanium (SiGe) layer formed over a dielectric layer stack which is formed over another layer, the dielectric layer stack comprising an opening exposing a conductive layer, whereby an interface layer separates the SiGe layer from the dielectric layer stack at least in the opening and from the exposed another layer in the opening, wherein the SiGe layer is deposited on the interface layer without having the interface layer exposed to an oxidizing ambient.

2. The MEMS device according to claim 1, wherein the another layer is a metal conductive layer.

3. The MEMS device according to claim 2, wherein the MEMS device is placed over a supporting substrate comprising an interconnect pattern and the metal conductive layer is the top metal layer of the interconnect pattern.

4. The MEMS device according to claim 1, wherein the another layer is a second SiGe layer.

5. The MEMS device according to claim 1, wherein the interface layer comprises a layer of TiN in contact with the SiGe layer.

6. The MEMS device according to claim 5, wherein the interface layer further comprises a layer of Ti in contact with the TiN layer and the another layer.

7. The MEMS device according to claim 1, wherein the interface layer comprises a layer of TaN in contact with the SiGe layer.

8. The MEMS device according to claim 7, wherein the interface layer further comprises a layer of Ta in contact with the TaN layer and the another layer.

9. The MEMS device according to claim 1, wherein the SiGe layer is also formed within the opening.

10. A method for manufacturing a MEMS device comprising:
    forming an opening in a dielectric layer stack to expose at least a portion of another layer below the dielectric layer stack;
    forming an interface layer at least on sidewalls of the opening and on an exposed surface of the another layer, and
    forming a silicon-germanium (SiGe) layer at least in a portion of the opening, wherein the SiGe layer is deposited on the interface layer without having the interface layer exposed to an oxidizing ambient,
    whereby the interface layer separates the SiGe layer from the dielectric layer stack at least in the opening and from the exposed another layer.

11. The method according to claim 10, wherein the another layer is a conductive metal layer.

12. The method according to claim 11, wherein the metal layer is the top metal layer of an interconnect pattern of a CMOS substrate.

13. The method according to claim 10, wherein the another layer is a second SiGe layer.

14. The method according to claim 10, wherein the interface layer comprises a layer of TiN in contact with the SiGe layer.

15. The method according to claim 14, wherein the interface layer further comprises a layer of Ti in contact with the TiN layer and the another layer.

16. The method according to claim 10, wherein the interface layer comprises a layer of TaN in contact with the SiGe layer.

17. The method according to claim 16, wherein the interface layer further comprises a layer of Ta in contact with the TaN layer and the another layer.

18. The method according to claim 10, wherein a soft sputter etch step is performed after the opening is formed and before forming of the interface layer.

19. The method according to claim 10, wherein the SiGe layer fills at least a portion of the opening.

* * * * *